United States Patent
Fogel et al.

(10) Patent No.: US 12,493,245 B2
(45) Date of Patent: Dec. 9, 2025

(54) ENHANCING EFFICIENCY OF RESIST PATTERNING

(71) Applicant: Orbotech Ltd., Yavne (IL)

(72) Inventors: Ofer Fogel, Yavne (IL); Manuela Hod, Yavne (IL); Uri Gold, Yavne (IL); Ronen Yogev, Yavne (IL)

(73) Assignee: Orbotech Ltd., Yavne (IL)

( * ) Notice: Subject to any disclaimer, the term of this patent is extended or adjusted under 35 U.S.C. 154(b) by 217 days.

(21) Appl. No.: 18/162,844

(22) Filed: Feb. 1, 2023

(65) Prior Publication Data
US 2024/0255854 A1    Aug. 1, 2024

(51) Int. Cl.
G03F 7/20    (2006.01)
G03F 7/38    (2006.01)
H05K 3/12    (2006.01)

(52) U.S. Cl.
CPC .......... G03F 7/2004 (2013.01); G03F 7/2051 (2013.01); G03F 7/38 (2013.01); H05K 3/1275 (2013.01); H05K 2203/0502 (2013.01)

(58) Field of Classification Search
CPC ...... G03F 7/38; G03F 7/70291; G03F 7/2051; H05K 2203/0502; H05K 3/1275; H05K 3/1283; H05K 3/0082
See application file for complete search history.

(56) References Cited

U.S. PATENT DOCUMENTS

| 6,646,274 | B1* | 11/2003 | Bleeker | B82Y 40/00 |
| | | | | 250/492.1 |
| 10,451,983 | B2* | 10/2019 | Chang | G03F 7/7005 |
| 11,464,116 | B2 | 10/2022 | Nagel | |
| 2003/0059719 | A1* | 3/2003 | Ohfuji | G03F 7/26 |
| | | | | 430/311 |
| 2003/0233528 | A1* | 12/2003 | Mei | G03F 7/70358 |
| | | | | 438/21 |
| 2004/0121617 | A1* | 6/2004 | Kawano | H01L 21/0273 |
| | | | | 257/E21.026 |
| 2004/0253838 | A1 | 12/2004 | Yamazaki et al. | |
| 2006/0215139 | A1* | 9/2006 | Oshida | G03F 7/70383 |
| | | | | 359/487.04 |
| 2006/0215143 | A1* | 9/2006 | Yamaguchi | G03F 7/7005 |
| | | | | 355/53 |
| 2008/0013062 | A1 | 1/2008 | Nagasaka | |
| 2010/0065547 | A1 | 3/2010 | Moffatt et al. | |
| 2015/0179473 | A1 | 6/2015 | Hunter et al. | |
| 2019/0187573 | A1* | 6/2019 | Cox | G03F 7/70783 |
| 2021/0092850 | A1* | 3/2021 | Nagel | G03F 7/2053 |

OTHER PUBLICATIONS

WIPO, International Search Report for PCT/IL2023/051304, Mar. 11, 2024.

* cited by examiner

Primary Examiner — Steven H Whitesell
(74) Attorney, Agent, or Firm — Hodgson Russ LLP

(57) ABSTRACT

A direct imaging system includes an ultraviolet radiation source, which is configured to irradiate a first area, having a first width, of a layer of a photoreactive material on a substrate with patterned ultraviolet radiation. A thermal energy source is configured to heat a second area of the layer of the photoreactive material while the ultraviolet radiation source irradiates the first area. The second area contains a part of the first area and having a second width less than the first width.

13 Claims, 3 Drawing Sheets

ENHANCING EFFICIENCY OF RESIST PATTERNING

FIELD

The present invention relates generally to electronics manufacturing, and particularly to methods and systems for optical patterning of photoreactive layers.

BACKGROUND

Photoreactive resists are widely used in manufacturing printed circuit boards. To produce a solder resist pattern on a printed circuit board (also referred to as a solder mask), for example, the board is coated with an unpolymerized layer of solder resist. A pattern of ultraviolet radiation is applied to polymerize the solder resist, after which the unpolymerized parts of the resist are washed away to expose the underlying conductive pads on the substrate. Photoresists are patterned in a similar fashion for producing circuit traces. The term "resist" is used in the present description and in the claims to refer generally to photoreactive materials used in patterning of circuit boards, including both solder resists and photoresists.

Most commonly, patterns are applied by irradiating a photoreactive resist with ultraviolet radiation through a photolithographic mask. On the other hand, in direct imaging systems, the patterned ultraviolet radiation is generated dynamically, for example using a scanning laser beam, an addressable array of radiation sources, or an addressable spatial light modulator, such as a liquid crystal device or a digital micromirror device (DMD).

U.S. Pat. No. 11,464,116 describes a lithographic exposure system and method for exposing and structuring a substrate coated with a solder resist. The lithographic exposure system has at least one light beam, formed in an embodiment by two or more laser beams of different UV wavelengths, which is deflected relative to the substrate by a variable deflection device, in order to generate structures on the substrate. In particular, the light beam is superimposed, spatially in the image plane and temporally in the exposure, by a spatially limited, high-energy, in an embodiment externally mounted heat source. In an embodiment, infrared laser diodes having linear optics are used.

SUMMARY

Embodiments of the present invention that are described hereinbelow provide improved methods and systems for patterning a resist.

There is therefore provided, in accordance with an embodiment of the invention, a direct imaging system, including an ultraviolet radiation source, which is configured to irradiate a first area, having a first width, of a layer of a photoreactive material on a substrate with patterned ultraviolet radiation. A thermal energy source is configured to heat a second area of the layer of the photoreactive material while the ultraviolet radiation source irradiates the first area, the second area containing a part of the first area and having a second width less than the first width. A motion assembly is configured to scan at least the second area across the layer of the photoreactive material.

In some embodiments, the first area is rectangular, having a given height perpendicular to the first width, and the second area extends across the height of the first area, thereby defining an elongated region that is heated by the thermal energy source. In disclosed embodiments, the motion assembly is configured to scan at least the second area across the layer of the photoreactive material in a direction perpendicular to the height of the first area. In one embodiment, the motion assembly is configured to translate the substrate in the direction perpendicular to the height, and the ultraviolet radiation source is configured to modify a pattern of the ultraviolet radiation the substrate translates. Additionally or as alternatively, the thermal energy source is configured to direct a beam of radiation to impinge on the second area, wherein the beam is shaped to fit the elongate region.

In one embodiment, the ultraviolet radiation source includes an array of light-emitting diodes. Alternatively or additionally, the ultraviolet radiation source includes a spatial light modulator, which applies predefined patterns to the ultraviolet radiation.

In some embodiments, the thermal energy source includes a source of infrared radiation and projection optics configured to project the infrared radiation over the second area. In one embodiment, the source of infrared radiation includes one or more infrared lasers.

Alternatively, the thermal energy source includes a convective heater, which is configured to direct a jet of heated gas to impinge on the second area, or a conductive heating element, which is configured to contact and convey heat to the photoreactive material across the second area.

In a disclosed embodiment, the photoreactive material includes a solder resist.

In some embodiments, the ultraviolet radiation is configured to irradiate multiple first areas, which are spaced apart on the substrate and staggered relative to a scan direction of the motion assembly, and the thermal energy source is configured to heat multiple second areas, containing parts of respective ones of the first areas.

There is also provided, in accordance with an embodiment of the invention, a method for direct imaging, which includes irradiating a first area, having a first width, of a layer of a photoreactive material on a substrate with patterned ultraviolet radiation. Heat is applied to a second area of the layer of the photoreactive material while the first area is irradiated with the pattern ultraviolet radiation, the second area containing a part of the first area and having a second width less than the first width. At least the second area is scanned across the layer of the photoreactive material.

The present invention will be more fully understood from the following detailed description of the embodiments thereof, taken together with the drawings in which:

DETAILED DESCRIPTION

Figure 1:
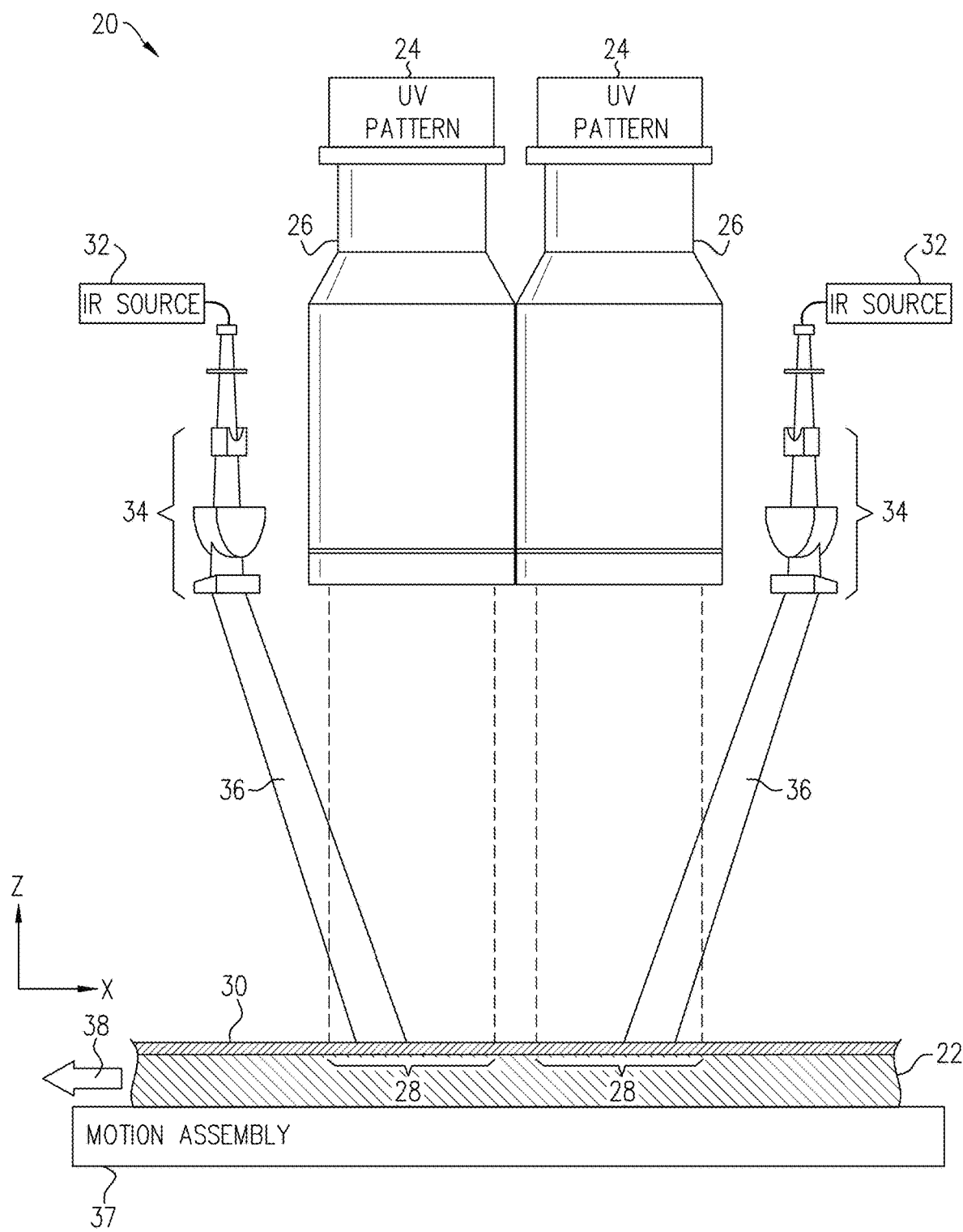
FIG. 1 is a schematic side view of a direct imaging system for patterning a printed circuit board (PCB), in accordance with an embodiment of the invention.

Proper polymerization of a resist layer on a printed circuit board typically requires at least a certain minimal fluence of ultraviolet energy on the surface of the layer. The "fluence" is the energy received by the layer per unit area and thus depends on the incident intensity of the ultraviolet radiation and the duration of exposure. In direct imaging systems, the available intensity is limited by the capabilities of the ultraviolet radiation source and its associated patterning and imaging optics. Therefore, to achieve the desired fluence, it becomes necessary to increase the exposure time, thus limiting the throughput of the system.

Embodiments of the present invention that are described herein address this problem by applying thermal energy to heat an area of the resist that is undergoing ultraviolet irradiation. Raising the temperature of the resist increases the rate of polymerization, thereby reducing the required ultraviolet fluence, reducing the required exposure time, and increasing the throughput of the direct imaging system. The thermal energy is applied transiently and locally, i.e., to only a small part of the area undergoing patterned ultraviolet irradiation at any given time. The inventors have found that this sort of transient local heating is advantageous in reducing thermal expansion of the printed circuit substrate, which can otherwise lead to distortion and loss of accuracy in the printed pattern.

Thus, the disclosed embodiments provide a direct imaging system, comprising an ultraviolet radiation source and a thermal energy source. The ultraviolet radiation source applies patterned ultraviolet radiation to irradiate a patterning area, having a certain height and width, of a layer of resist on a substrate. (In the present disclosure and in the claims, the terms "height" and "width" are used arbitrarily, for the sake of convenience, to denote the dimensions of areas on the surface of the substrate and do not imply any particular physical orientation of these dimensions.) While the ultraviolet radiation source irradiates the entire patterning area, a thermal energy source simultaneously heats the layer of resist within only a part of the patterning area, such that at least 80% of the thermal energy is applied to a heated area that is no more than 20% of the patterning area, for example. The source of thermal energy may be radiative, convective, or conductive, for example.

In the embodiments that are described hereinbelow, the width of the heated area is less than the width of the patterning area. In these embodiments, the heated area is an elongated region, extending across the height of the rectangular patterning area, but with a much narrower width. A motion assembly scans at least the heated area across the layer of resist and may scan the patterning area, as well, typically in a scan direction perpendicular to the height of the heated area. For example, the motion assembly may translate the substrate in the direction perpendicular to the height. Alternatively or additionally, the motion assembly may shift the heated area and possibly the patterning area across the substrate.

FIG. 1 is a schematic side view of a direct imaging system 20 for patterning a printed circuit board (PCB) substrate 22, in accordance with an embodiment of the invention. System 20 comprises one or more ultraviolet radiation sources 24, which generate patterned ultraviolet radiation corresponding to a pattern of conductive material, such as a solder resist, that is to be formed on substrate 22. Prior to irradiation, substrate 22 is coated with a layer of a suitable resist 30. Optics 26 focus the patterned radiation generated by each radiation source 24 to irradiate a corresponding patterning area 28 of the resist layer.

Figure 3:
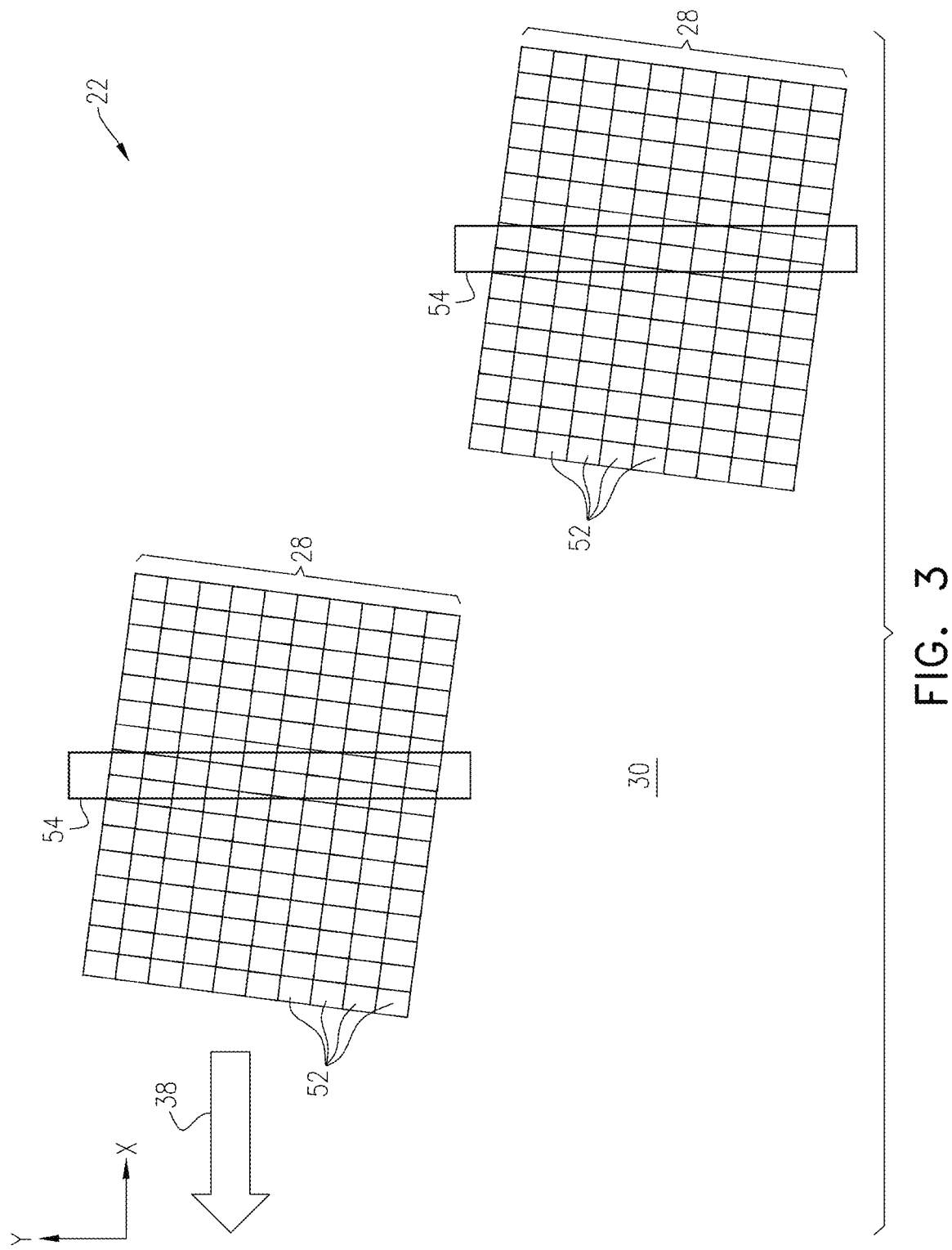
FIG. 3 is a schematic frontal view of a printed circuit substrate showing patterns of radiation projected onto the substrate in a direct imaging process, in accordance with an embodiment of the invention.

Concurrently with the ultraviolet irradiation by sources 24, one or more radiation sources 32 generate thermal energy. In the present example, radiation sources 32 are assumed to emit near-infrared radiation; but alternatively, radiation sources 32 may emit electromagnetic radiation in any suitable wavelength band from the visible through the far infrared range (at wavelengths between 500 nm and 12 μm). Projection optics 34 shape and project the infrared radiation to generate elongated infrared beams 36, which heat corresponding elongated areas of resist 30 within patterning areas 28. Radiation sources 32 may be coupled to projection optics 34 by suitable high-power optical fibers. The area heated by each beam 36 contains a part of the corresponding patterning area 28, with a width less than that of the patterning area, as illustrated in FIG. 3.

A motion assembly 37 translates substrate 22 in a process direction indicated by an arrow 38. (The process direction is taken to be the X-direction in the pictured example, and the widths of the patterning area and the heated area are taken to be the respective dimensions of the areas in the X-direction, while the heights are the dimensions in the Y-direction.) Translation of substrate 22 causes patterning areas 28 and the areas heated by beams 36 to scan across the layer of resist 30 in the X-direction, perpendicular to the height of the elongated areas heated by infrared beams 36. As substrate 22 is translated, ultraviolet radiation source 24 modifies the pattern of the ultraviolet radiation that it outputs in order to generate the desired exposure pattern on resist 30.

In the example shown in FIG. 1, system 20 comprises radiation sources 24 and two thermal two ultraviolet radiation (e.g., IR) sources 32 with corresponding optics, all operating in parallel. This arrangement is advantageous in increasing the throughput of system 20, since it enables the system to irradiate multiple areas of the substrate simultaneously. Alternatively, system 20 may comprise a larger number of ultraviolet and infrared radiation sources, or only a single source of each type. In one embodiment, multiple patterning areas 28 are staggered to cover a large area or even the entire area of substrate 22 in a single pass, for example as shown in FIG. 3.

In some embodiments, radiation sources 32 comprise high-power semiconductor devices, for example, semiconductor lasers, such as laser diodes, vertical-cavity surface-emitting lasers (VCSELs), or light-emitting diodes (LEDs). These infrared sources 32 may operate at any suitable wavelength within the near infrared range. The wavelength may be optimized for the type of resist 30 that has been applied to substrate 22, for example using longer wavelengths for white solder resist, which tends to scatter light at wavelengths close to the visible range. As yet another example, each radiation source 32 may comprise a linear filament with a suitable reflector (in which case additional projection optics 34 may not be needed).

Alternatively, system 20 may comprise other types of thermal energy sources, in addition to or instead of infrared sources 32. For example, the thermal energy source may comprise a convective heater, which directs a long, narrow jet of heated air or other heated gas to impinge on the elongate area that is to be heated. As another example, the thermal energy source may comprise a conductive heating element, such as a heated bar, which contacts resist 30 or substrate 22 across the area that is to be heated.

Figure 2:
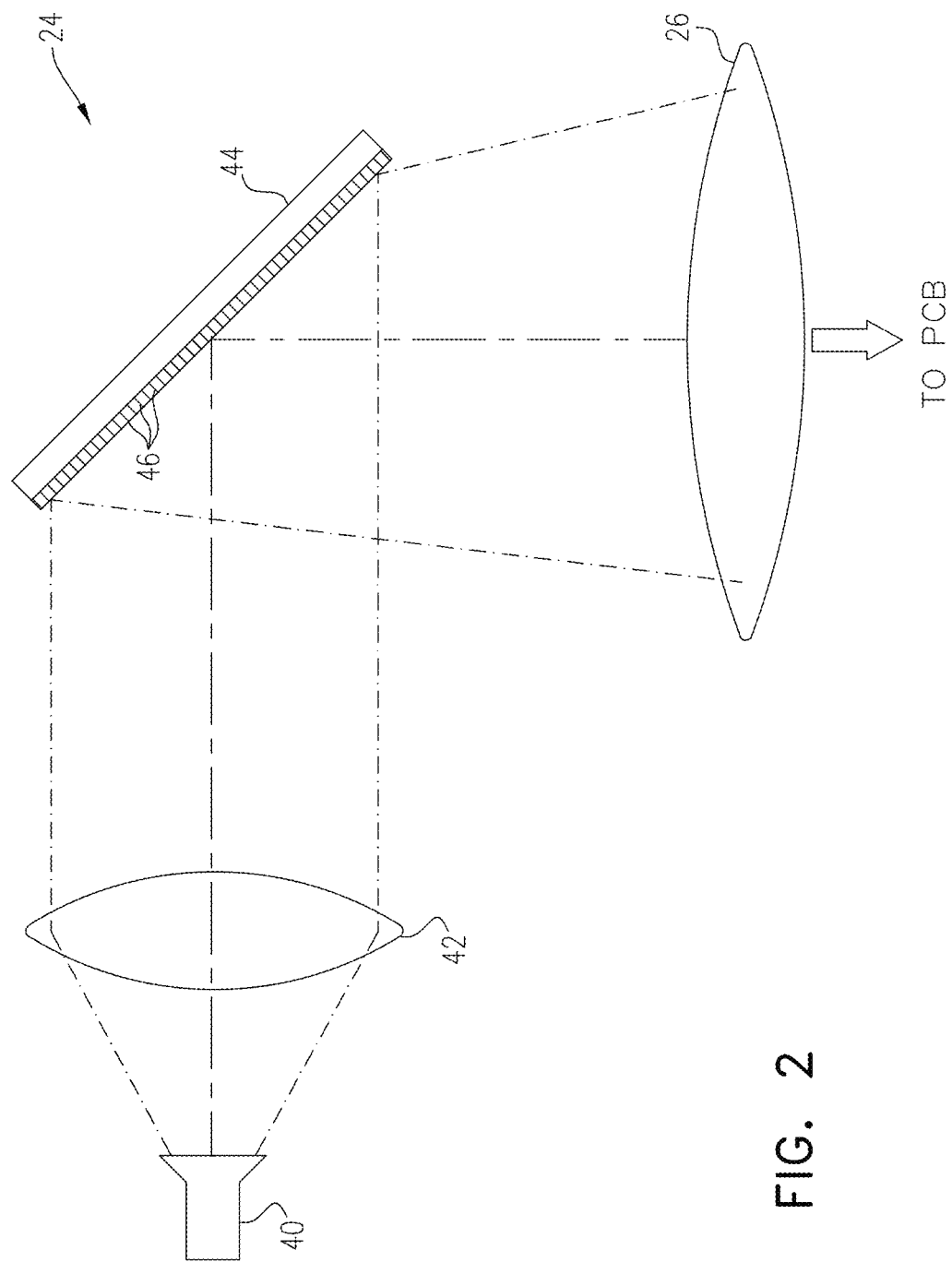
FIG. 2 is a schematic detail view of an optical patterning assembly, in accordance with an embodiment of the invention.

FIG. 2 is a schematic detail view of an optical patterning assembly, including ultraviolet radiation source 24 and optics 26, in accordance with an embodiment of the invention. In the pictured embodiment, an ultraviolet emitter 40, such as a discharge lamp, laser, or solid-state device, emits a beam of ultraviolet radiation. Collimating optics 42 collimate and direct the ultraviolet beam toward a spatial light modulator 44. In the present example, spatial light modulator 44 comprises a digital micromirror device (DMD), comprising an addressable array of micromirrors 46, which are controlled to apply predefined patterns to the ultraviolet radiation for projection onto patterning area 28. Alternatively, other sorts of spatial light modulators may be used, such as liquid crystal pixel arrays.

In an alternative embodiment, ultraviolet radiation source 24 comprises an addressable array of ultraviolet-emitting LEDs, which are switched on and off to generate the desired patterns. In this case, spatial light modulator 44 may not be required.

FIG. 3 is a schematic frontal view of PCB substrate 22 showing patterns of radiation projected onto the substrate in a direct imaging process in system 20, in accordance with an embodiment of the invention. The optical patterning assembly projects multiple patterns of ultraviolet radiation, each comprising an array of pixels 52, onto respective patterning areas 28. The thermal energy source heats an elongated area 54 that extends across the height (Y-dimension) of each patterning area 28 but is considerably narrower in width (X-dimensions) than the patterning area. Although FIG. 3 shows two instances of areas 28 and 54, three or more areas of each type may be irradiated in parallel to increase the throughput of system 20. Alternatively, system 20 may operate on only a single patterning area with a single heated area.

Translation of substrate 22 in the process direction indicated by arrow 38 causes areas 28 and 54 to scan across resist 30. During the scan, radiation sources 24 modifies the values of pixels 52 to create the desired patterns over the entire surface of PCB substrate 22. The arrays of pixels 52 are skewed relative to the process direction (indicated by arrow 38) to enable patterning of features with resolution finer than the pitch of pixels 52. Areas 28 are staggered to cover a wide area in the Y-direction in a single scan of substrate 22 (and possibly to cover the entire substrate in a single scan). Staggering areas 28 along the process direction, as shown in FIG. 3, is useful in relieving space constraints on optics 26 and in spreading apart heated areas 54 to avoid local overheating. Although heated areas 54 are shown in FIG. 3 to be centered along the X-direction within patterning areas 28, heated areas 54 may alternatively be displaced from the center. For example, heated areas 54 may be displaced toward the leading edges of patterning areas 28.

The motion assembly 37, radiation sources 32, ultraviolet radiation sources 24, and/or other components in the system 20 can be controlled using a controller. The controller typically comprises a programmable processor, which is programmed in software and/or firmware to carry out the functions that are described herein, along with suitable digital and/or analog interfaces for connection to the other elements of system 20. Alternatively or additionally, the controller comprises hard-wired and/or programmable hardware logic circuits, which carry out at least some of the functions of the controller. The controller may comprise a single control unit or multiple, interconnected control units, with suitable interfaces for receiving and outputting the signals that are illustrated in the figures and are described in the text. Program code or instructions for the controller to implement various methods and functions disclosed herein may be stored in readable storage media, such as a memory in the controller or other memory.

Although certain embodiments are described above, for the sake of concreteness and clarity, in the specific context of system 20, as illustrated in FIGS. 1-3, the principles of the present invention may similarly be applied, mutatis mutandis, in patterning of resists in other sorts imaging of direct systems. Thus, the embodiments described above are cited by way of example, and the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A direct imaging system, comprising:
an ultraviolet radiation source, which is configured to irradiate a first area, having a first width, of a layer of a photoreactive material on a substrate with a pattern of ultraviolet radiation;
a thermal energy source, which is configured to heat a second area of the layer of the photoreactive material while the ultraviolet radiation source irradiates the first area, the second area containing a part of the first area and having a second width less than the first width, wherein the thermal energy source comprises a source of infrared radiation and projection optics configured to project infrared radiation over the second area, wherein the first area is rectangular, having a height perpendicular to the first width, wherein the second area extends across the height of the first area, thereby defining an elongated region that is heated by the thermal energy source, wherein the infrared radiation from the thermal energy source is shaped to fit the elongated region, and wherein the source of infrared radiation comprises only one infrared laser; and
a motion assembly, which is configured to scan at least the second area across the layer of the photoreactive material.

2. The system according to claim 1, wherein the motion assembly is configured to scan at least the second area across the layer of the photoreactive material in a direction perpendicular to the height of the first area.

3. The system according to claim 2, wherein the motion assembly is configured to translate the substrate in the direction perpendicular to the height, and wherein the ultraviolet radiation source is configured to modify the pattern of ultraviolet radiation as the substrate translates.

4. The system according to claim 1, wherein the ultraviolet radiation source comprises an array of light-emitting diodes.

5. The system according to claim 1, wherein the ultraviolet radiation source comprises a spatial light modulator, which applies predefined patterns of ultraviolet radiation.

6. The system according to claim 1, wherein the photoreactive material comprises a solder resist.

7. The system according to claim 1, wherein the ultraviolet radiation is configured to irradiate a plurality of first areas, which are spaced apart on the substrate and staggered relative to a scan direction of the motion assembly, and wherein the thermal energy source is configured to heat a plurality of second areas, containing parts of respective ones of the plurality of first areas.

8. A method for direct imaging, comprising:
irradiating a first area, having a first width, of a layer of a photoreactive material on a substrate with a pattern of ultraviolet radiation;
applying heat to a second area of the layer of the photoreactive material while the first area is irradiated with the pattern of ultraviolet radiation, the second area containing a part of the first area and having a second width less than the first width, wherein applying the heat comprises projecting infrared radiation over the second area using one infrared laser, wherein the first area is rectangular, having a height perpendicular to the first width, and wherein the second area extends across the height of the first area, thereby defining an elongated region that is heated by a thermal energy source, wherein the infrared radiation is shaped to fit the elongated region, and wherein the source of infrared radiation comprises only the one infrared laser; and scanning at least the second area across the layer of the photoreactive material.

9. The method according to claim 8, wherein scanning at least the second area comprises shifting the first area and the second area across the layer of the photoreactive material in a direction perpendicular to the height of the first area.

10. The method according to claim 9, wherein shifting the first area and the second area comprises translating the substrate in the direction perpendicular to the height, and wherein irradiating the first area comprises modifying the pattern of ultraviolet radiation as the substrate translates.

11. The method according to claim 8, wherein irradiating the first area comprises operating an array of ultraviolet light-emitting diodes to irradiate the first area or operating a spatial light modulator to apply predefined patterns of ultraviolet radiation.

12. The method according to claim 8, wherein the photoreactive material comprises a solder resist.

13. The method according to claim 8, wherein irradiating the first area comprises irradiating a plurality of first areas, which are spaced apart on the substrate and staggered relative to a direction of the scanning, with the pattern of ultraviolet radiation, and wherein applying the heat comprises heating a plurality of second areas, containing parts of respective ones of the plurality of first areas.

\* \* \* \* \*